United States Patent [19]

Caldwell et al.

[11] Patent Number: 4,748,399
[45] Date of Patent: May 31, 1988

[54] MULTICHANNEL PHASE NOISE MEASUREMENT SYSTEM

[75] Inventors: Stephen P. Caldwell, Linthicum; James T. Haynes, Pasadena; Michael S. Buchalter, Columbia, all of Md.

[73] Assignee: The United States of America as represented by the Secretary of the Air Force, Washington, D.C.

[21] Appl. No.: 853,827

[22] Filed: Apr. 21, 1986

[51] Int. Cl.4 ............................................. G01R 27/00
[52] U.S. Cl. ................................. 324/57 N; 324/77 B
[58] Field of Search ........................... 324/57 N, 77 B; 455/135, 133

[56] References Cited

U.S. PATENT DOCUMENTS

| | | | |
|---|---|---|---|
| 3,535,635 | 10/1970 | Okumura | 324/158 |
| 3,619,774 | 11/1971 | Landwehr | 324/57 N |
| 3,711,769 | 1/1973 | Peake | 324/57 N |
| 3,716,785 | 2/1973 | Masters et al. | 324/77 B |
| 3,835,378 | 9/1974 | Edden et al. | 324/57 R |

OTHER PUBLICATIONS

Reynolds, "Measure Phase Noise in One of Three Ways", Electronics Design 4, 15 Feb. 1977, pp. 106-108.

Sal'nichenko, "Low-Frequency Noise Spectrum Analyzer", Instrum. & Exp. Tech. (USA), vol. 19, No. 5, Mar. 1977, pp. 1358-1360.

Primary Examiner—Reinhard J. Eisenzopf
Assistant Examiner—Robert W. Mueller
Attorney, Agent, or Firm—Donald J. Singer; William G. Auton

[57] ABSTRACT

A multichannel phase noise measuring system is disclosed which is capable of measuring the phase noise of two signal source operating between 100 MH$_z$ and 24 GH$_z$. This system has two input channels and a mixer which produces a difference frequency between the signals received in the input channels. The difference frequency containing the phase noise is frequency multiplied and amplified to raise the phase noise level 12 dB. The multiplied and amplified difference signal is phase locked to a commercially available frequency synthesizer with inferior noise characteristics to the units being tested. By amplifying the phase noise of the original signals above the phase noise levels of the commercially available frequency synthesizer, they become measurable.

1 Claim, 3 Drawing Sheets

MULTICHANNEL PHASE NOISE MEASUREMENT SYSTEM

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to noise measuring systems, and more specifically to a multichannel phase noise measuring system which amplifies the phase noise of the unit being tested in order to use commercial synthesizers which produce noise levels which exceed that of the tested unit.

Phase noise is a measure of the random phase instability of a signal. Phase noise is commonly measured by frequency analyzers, but commercially available units have limited dynamic ranges and limited frequency bandwidths.

The task of using commercially available equipment to measure multichannel phase noise is alleviated, to some extent, by the following U.S. patents and technical articles, which are incorporated herein by reference:

U.S. Pat. No. 3,535,635 issued to T. Okumura on Oct. 20, 1970;

U.S. Pat. No. 3,711,769 issued to M. Peake on Jan. 16, 1973;

U.S Pat. No. 3,716,785 issued to H. Masters et al on Feb. 13, 1973;

U.S. Pat. No. 3,835,738 issued to F. Edden et al on Sept. 10, 1974;

"Measure Phase Noise In One Of Three Ways" Chuck Reynolds, Electronic Design 4, Feb. 15, 1977, pp 106–108; and "Low - Frequency Noise Spectrum Analyzer", A. Sal'nichenko, Instrum. & Exp. Tech. (U.S.A.) Vol. 19, No. 5 (Mar 1977) pp 1358–1360.

The above-cited references are exemplary in the art, and all describe noise measurement systems. A common technique entails the use of a mixer to translate the tested radio-frequency signal down in frequency to the range of the frequency analyzer. When using such a technique, the mixer receives both the radio frequency signal which is being tested, and a reference signal from a phased-locked signal source. The mixer outputs an intermediate frequency signal which is processed by a low-pass filter and analyzed by a frequency analyzer. The problem with this approach is that the reference signal source must have better phase-noise charateristics than the unit under test.

A critical need of a doppler radar system is a low phase noise output. Measuring such low phase noise levels can be difficult, particularly when the commercial test equipment has phase noise levels higher than that of the unit to be measured.

In view of the foregoing discussion, it is apparent that there currently exists the need for a system capable of amplifying the phase noise of the unit being tested in order to use commercial synthesizers having noise levels exceeding that of the unit being tested. The present invention is intended to satisfy that need.

SUMMARY OF THE INVENTION

The present invention is a multichannel phase noise measuring system which amplifies the phase noise of the units being tested so that a commercial synthesizer can be used which has noise levels greater than the units being tested.

One embodiment of the invention allows the measurements of phase noise of two units using: two mixers, a plurality of frequency multiplier circuits, a commercial synthesizer, a phase locked loop circuit, and a frequency analyzer. The units that were tested were two identical synthesizers operating over a frequency range of 1600–1800 $MH_z$. When the first unit was set to 1700 $MH_z$ and the second to 1735 $MH_z$, the first mixer receives their signals over two channels and outputs the beat frequency of 35 $MH_z$, which is also known as a difference frequency.

The difference frequency signal is sent to the plurality of frequency multiplexer circuits to provide sufficient gain to the phase noise of the units so that it is measurable above the noise produced by the commercial synthesizer. In one embodiment of the invention, two frequency multiplier circuits, each being a frequency multiplier in series with an amplifier, were used to quadruple the difference frequency signal. The result is that the 35 $MH_z$ signal, and a 12 dB gain was applied to the phase noise of the units being tested. Note that the amount of gain applied to the phase noise was selected to enable it to be xeasurable over the noise of the commercially available synthesizer.

The multiplied difference signal from the frequency multiplier circuits is received and phase locked with the signal from the commercial synthesizer using: the second mixer, a video amplifier, and the commercial synthesizer. Since the phase noise of the units being tested have been raised above the noise of the commercial synthesizer, the phase noise is xeasurable by the frequency analyzer at the output of the second mixer. Note that since the phase noise of the units has had a 12 dB gain applied to it, the actual estimate of the phase noise is 12 dB beneath that measured by the frequency analyzer. Additionally, although a multiply-by-four frequency multiplier combination was used to acquire 12 dB of phase noise gain, larger frequency multipliers can be used for larger phase noise gains. This allows commercial frequency synthesizers to be used to test units which possess superior phase noise levels.

It is an object of the present invention to provide a multichannel phase noise measurement system.

It is another object of the present invention to measure phase noise of units with the use of commercial frequency synthesizers which have inferior phase noise levels to the units being tested.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is a multichannel phase noise measurement system.

Figure 1:
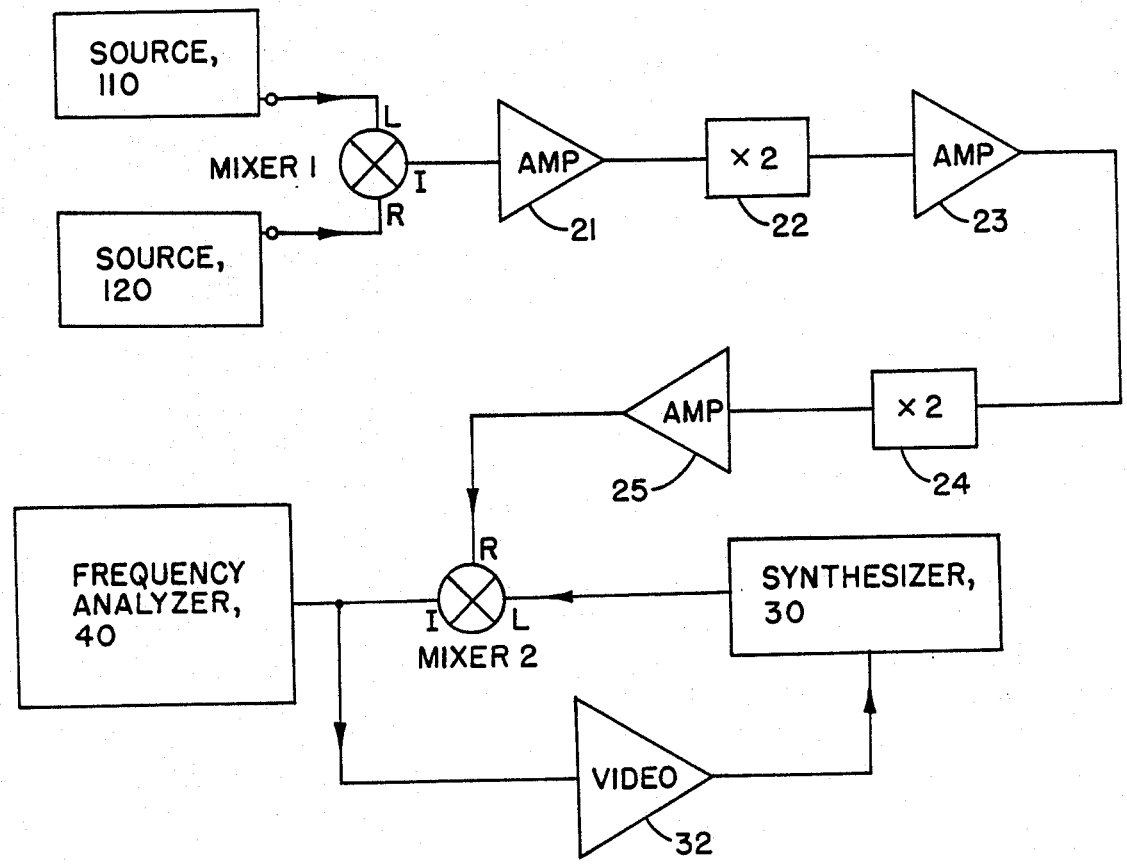
FIG. 1 is a schematic of an embodiment of the present invention.

The reader's attention is now directed towards FIG. 1, which is a schematic of an embodiment of the present invention. The embodiment of FIG. 1 was designed to test two identical synthesizers 110 and 120. Both units have 5 MH$_z$ channel spacing operating over the frequency range of 1600–1800 MH$_z$, and have the expected phase noise levels shown in FIG. 2.

Figure 3:
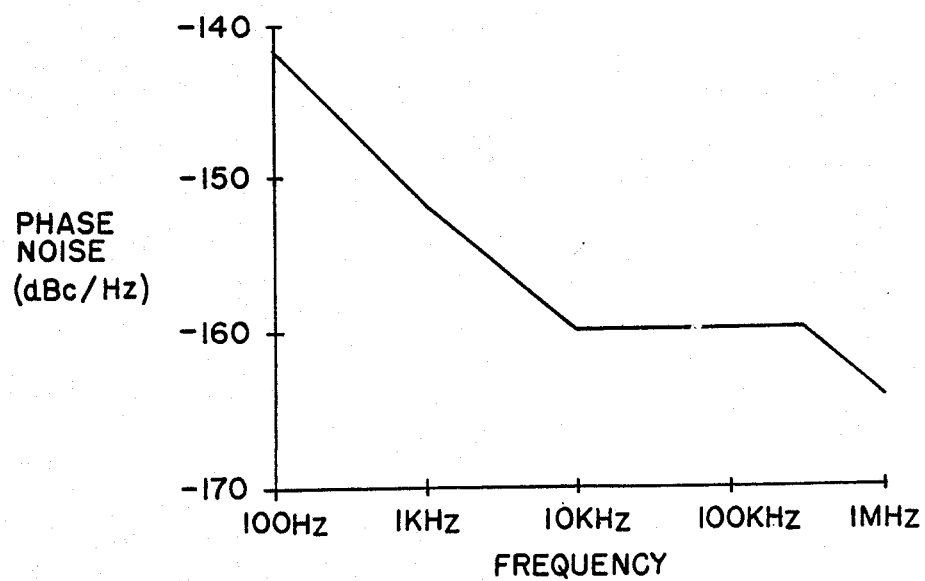
FIG. 3 is a chart depicting the phase noise flow of the invention of FIG. 1.

When the first unit 110 is set to 1700 MH$_z$, and the second unit 120 is set to 1735 MH$_z$, a beat frequency of 35 MH$_z$ is present at the output of mixer 1. Note that this embodiment requires that the two units 110 and 120 produce a difference frequency of 30–40 MH$_z$ for the optimum noise floor, but other difference frequencies can be used which are as much as 50 MH$_z$ by sacrificing 10 dB from the noise measurement floor of FIG. 3.

The output of mixer 1 is a difference frequency signal of 35 MH$_z$, which is quadrupled to 140 MH$_z$ using two frequency multiplier circuits 21–24. Each of the frequency multiplier circuits doubles the signal entering in using an amplifier 21 and 23, and frequency multiplier 22 and 24. Although a multiply-by-four frequency multiplier combination was used to acquire with an amplifier 25 to acquire 12 dB of phase noise gain, larger frequency multipliers can be used for larger phase noise gains.

Figure 2:
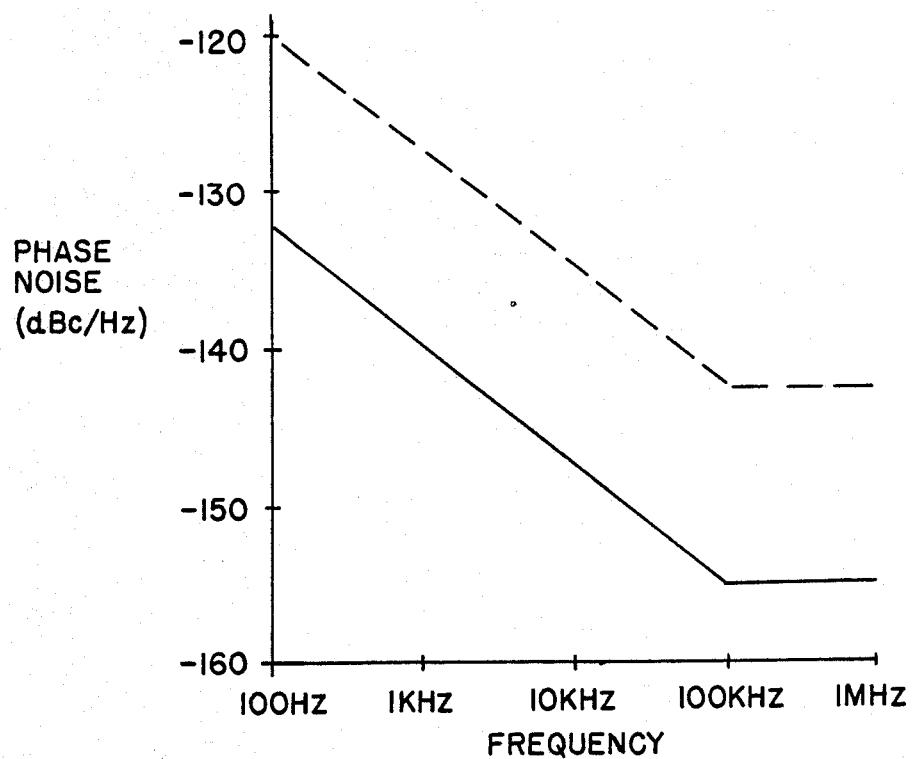
FIG. 2 is a chart depicting the expected phase noise of the units being tested, and the amplified phase noise after the difference frequency is quadrupled.

The 12 dB phase noise gain in FIG. 1 is accomplished with the amplifiers 21, 23 and 25. Amplifiers 21 and 23 each provide gains of 13 dB and amplifier 25 provides a 7 dB gain. Phase noise losses of 3 dB are produced by each frequency multiplier 22 and 24 and the mixer 1. The multiplied difference signal output by amplifier 25 is the difference signal of 35 MH$_z$ quadrupled to 140 'MH$_z$ with a phase noise gain of 12 dB. Since the original difference signal can range from 30–40 MH$_z$, the output of amplifier 25 can range from 120–160 MH$_z$. The dashed line in FIG. 2 represents the expected phase noise after the difference frequency is quadrupled. The solid line of FIG. 2 represents the expected phase noise of units 110 and 120.

Figure 4:
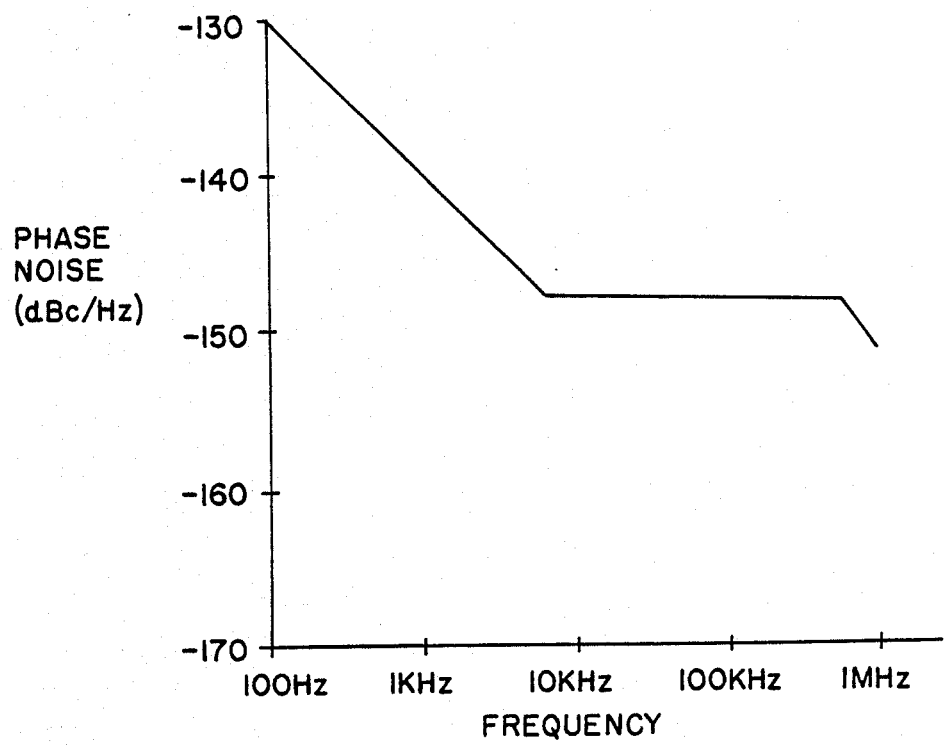
FIG. 4 is a chart depicting the measured phase noise of the commercial frequency synthesizer at 160 $MH_z$.
Figure 5:
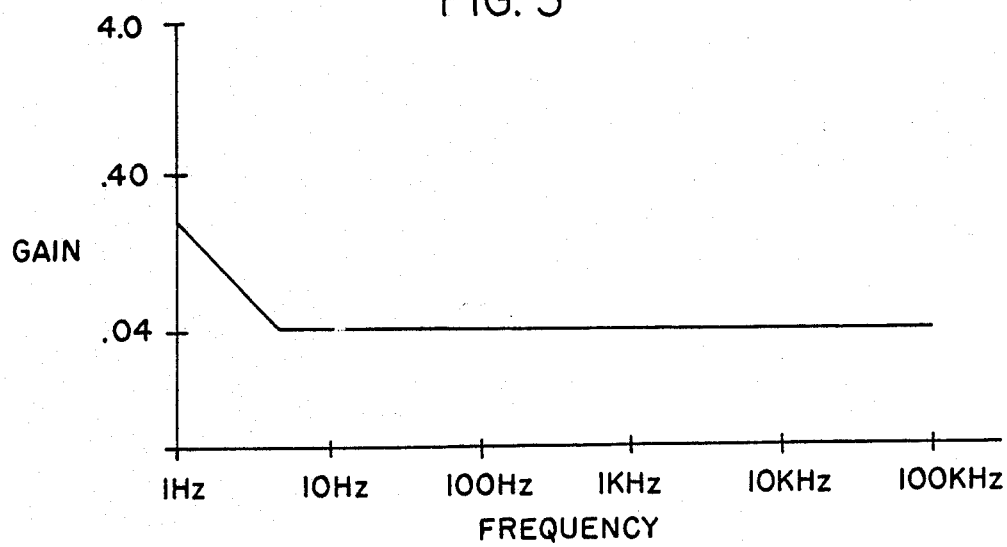
FIG. 5 is a chart depicting the frequency response of the video amplifier used in FIG. 1.

The multichannel difference frequency signal from amplifier 25 is phase locked with a commercial frequency synthesizer using a phase locked loop composed of: a video amplifier 32, the commercial frequency synthesizer 30, and mixer 2. The commercial frequency synthesizer is a HP 8663 which has the measured phase noise characteristics depicted in the chart of FIG. 4. The video amplifier 32 has a frequency response as depicted in the chart of FIG. 5. The video amplifier frequency response is chosen to provide phase locked loop stability and low D.C. levels to the output of mixer 2.

Since the present invention has raised the phase noise levels 12 dB, as shown in the dashed line of FIG. 2, the noise is larger than that of the HP 8663 and is present and measurable by the frequency spectrum analyzer 40 at the output of mixer 2.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. In combination with a first and second signal source which respectively produce first and second output signals which have phase noise, a multichannel phase noise measuring system comprising:

a first mixer which receives and mixes said first and second output signals from said first and second signal sources to produce a difference frequency signal;

a first amplifier which produces a first amplified difference signal by receiving and amplifying the difference signal produced by the first mixer;

a first frequency multiplier which produces an output signal by receiving and frequency multiplying the first amplified difference signal from the first amplifier;

a second amplifier which produces a second amplified difference signal by receiving and amplifying the output signal of the first frequency multiplier;

a second frequency multiplier which produces an output signal by receiving and frequency multiplying the second amplified difference signal from the second amplifier;

an output amplifier which produces a multiplied frequency signal by receiving and amplifying the output signal of the second frequency multiplier, said multiplied frequency signal including the phase noise of the first and second output signals with a positive gain applied to it, said positive gain thereby allowing commercial frequency synthesizers with phase noise characteristics inferior to said first and second signal sources to be used to help measure said phase noise;

a frequency synthesizer which produces a reference frequency signal wherein said frequency synthesizer has inferior phase noise characteristics to the first and second signal source;

a second mixer which produces an output signal by receiving and mixing the multiplied frequency signal from the output amplifier and the reference frequency signal from the frequency synthesizer;

a video amplifier which receives the output signal from the second mixer and provides a tuning signal to the frequency sythesizer to phase lock it with the multiplied frequency signal received by the second mixer, said video amplifier and said second mixer thereby causing said frequency synthesizer to be phase locked with said multiplied frequency signal by producing said output signal of said second mixer which includes the phase noise of the first and second output signals with the positive gain applied to it; and a means of measuring phase noise which receives the output signal of the second mixer and produces a measurement which indicates the amount of phase noise present in the first and second output signals.

* * * * *